(12) United States Patent
Liu et al.

(10) Patent No.: US 11,025,030 B2
(45) Date of Patent: Jun. 1, 2021

(54) OPTICAL MODULE

(71) Applicant: Hisense Broadband Multimedia Technologies Co., Ltd., Shandong (CN)

(72) Inventors: Xuxia Liu, Shandong (CN); Yan Zhong, Shandong (CN)

(73) Assignee: HISENSE BROADBAND MULTIMEDIA TECHNOLOGIES CO., LTD., Qingdao (CN)

( * ) Notice: Subject to any disclaimer, the term of this patent is extended or adjusted under 35 U.S.C. 154(b) by 0 days.

(21) Appl. No.: 16/539,285

(22) Filed: Aug. 13, 2019

(65) Prior Publication Data
US 2020/0021081 A1    Jan. 16, 2020

Related U.S. Application Data

(63) Continuation of application No. PCT/CN2019/093773, filed on Jun. 28, 2019.

(30) Foreign Application Priority Data

Jul. 12, 2018 (CN) .......................... 201810766088.6

(51) Int. Cl.
*H01S 5/02255* (2021.01)
*H01S 5/02251* (2021.01)
(Continued)

(52) U.S. Cl.
CPC ........ *H01S 5/02251* (2021.01); *G02B 6/4214* (2013.01); *H01S 5/02255* (2021.01);
(Continued)

(58) Field of Classification Search
CPC ............. H01S 5/02248; H01S 5/02284; H01S 5/02292; H01S 5/0683; H01S 5/02251;
(Continued)

(56) References Cited

U.S. PATENT DOCUMENTS

| 2013/0094807 A1 | 4/2013 | Shao et al. |
| 2014/0294400 A1 | 10/2014 | Liao et al. |

(Continued)

FOREIGN PATENT DOCUMENTS

| CN | 100409054 C | 8/2008 | |
| CN | 103293649 A * | 9/2013 | ........... G02B 27/126 |

(Continued)

OTHER PUBLICATIONS

State Intellectual Property Office of the People's Republic of China, Office Action and Search Report Issued in Application No. 201810766088.6, dated May 8, 2019, 13 pages,(Submitted with Machine Translation).

(Continued)

*Primary Examiner* — Michael Carter
(74) *Attorney, Agent, or Firm* — Hauptman Ham, LLP

(57) ABSTRACT

An optical module includes a circuit board, an optical fiber, an optical fiber monitoring chip, a laser chip, a laser driving chip and a lens assembly. A bottom surface of the lens assembly is covered above the laser chip and the optical monitoring chip. A groove is on a top surface of the lens assembly. A bottom of the groove protrudes to form a first interface and a second interface. The laser chip is configured to emit light. The first interface is configured to reflect the emitted light to obtain first reflected light. The second interface is configured to reflect a portion of the first reflected light to obtain a second reflected light and refract another portion of the first reflected light to obtain a first refracted light. The second reflected light is transmitted to the optical monitoring chip. The first refracted light is transmitted to the optical fiber.

10 Claims, 3 Drawing Sheets

(51) Int. Cl.
  *H04B 10/50* (2013.01)
  *H01S 5/18* (2021.01)
  *G02B 6/42* (2006.01)
  *H04B 10/25* (2013.01)
  *H01S 5/02325* (2021.01)
  *H01S 5/0683* (2006.01)

(52) U.S. Cl.
  CPC ............ *H01S 5/02325* (2021.01); *H01S 5/18* (2013.01); *H04B 10/25* (2013.01); *H04B 10/504* (2013.01); *H01S 5/0683* (2013.01)

(58) Field of Classification Search
  CPC ..... H01S 5/18; H01S 5/02255; G02B 6/4214; G02B 6/4286; H04B 10/25
  See application file for complete search history.

(56) References Cited

U.S. PATENT DOCUMENTS

2015/0030285 A1* 1/2015 Tanazawa ............ G02B 6/4286
  385/31
2015/0331211 A1* 11/2015 Kuo ........................ G02B 6/428
  385/14

FOREIGN PATENT DOCUMENTS

| | | | |
|---|---|---|---|
| CN | 103293649 A | 9/2013 | |
| CN | 106324771 A | 1/2017 | |
| CN | 206057645 U | 3/2017 | |
| CN | 107121737 A | 9/2017 | |
| CN | 206725818 U | 12/2017 | |
| CN | 107957610 A | 4/2018 | |
| CN | 108919433 A | 11/2018 | |
| EP | 3109681 A1 | 12/2016 | |
| JP | 2011039151 A | * 2/2011 | ........... G02B 6/4214 |
| WO | 2014180024 A1 | 11/2014 | |

OTHER PUBLICATIONS

ISA State Intellectual Property Office of the People's Republic of China, International Search Report Issued in Application No. PCT/CN2019/093773, dated Sep. 27, 2019, WIPO, 5 pages.

* cited by examiner

OPTICAL MODULE

CROSS-REFERENCE TO RELATED APPLICATIONS

This application is a continuation application of International Application No. PCT/CN2019/093773 filed on Jun. 28, 2019, which claims priority to Chinese Patent Application No. 201810766088.6 filed on Jul. 12, 2018, the entireties of which are incorporated herein by reference.

TECHNICAL FIELD

The present disclosure relates to optical communication, and in particular to an optical module.

BACKGROUND

Optical power of a laser chip in an optical module is an important monitoring index. A vertical cavity surface laser chip emits upward one light beam along a direction perpendicular to a surface. There is a need for the optical module using the vertical cavity surface laser chip to perform optical power monitoring by separating partial light from a light beam.

SUMMARY

An optical module according to some embodiments of the present disclosure includes a circuit board, an optical fiber, a laser chip, a laser driving chip, an optical monitoring chip and a lens assembly. The optical monitoring chip, the laser driving chip and the laser chip are on a surface of the circuit board. The laser chip is between the optical fiber and the optical monitoring chip. The laser driving chip is between the optical monitoring chip and the laser chip. A bottom surface of the lens assembly is covered above the laser chip and the optical monitoring chip. A groove is disposed on a top surface of the lens assembly, and a bottom of the groove protrudes to form a first interface and a second interface. The laser chip is configured to emit light. The first interface is configured to reflect the emitted light to obtain first reflected light. The second interface is configured to reflect a portion of the first reflected light to obtain a second reflected light and refract another portion of the first reflected light to obtain a first refracted light, wherein the second reflected light is transmitted to the optical monitoring chip, and the first refracted light is transmitted to the optical fiber.

It should be noted that the above general descriptions and subsequent detailed descriptions are merely illustrative and explanatory, and are not limiting of the present disclosure.

BRIEF DESCRIPTION OF THE DRAWINGS

To describe the technical solutions in the example embodiments of the present disclosure more clearly, accompanying drawings required in descriptions of the example embodiments will be briefly introduced below. It is apparent that the accompanying drawings described below are merely some examples of the various embodiments of the present disclosure and other drawings may also be obtained by those of ordinary skill in the art without paying creative work.

DETAILED DESCRIPTION OF THE EMBODIMENTS

Detailed descriptions will be made below to the present disclosure in combination with various embodiments shown by the accompanying drawings. However, these embodiments are not limiting of the present disclosure and any modifications made by those of ordinary skill in the art to structures, methods or functions according to these example embodiments shall be encompassed in the scope of protection of the present disclosure.

The term used in the present disclosure is for the purpose of describing a particular example only, and is not intended to be limiting of the present disclosure. The singular forms such as "a", "said", and "the" used in the present disclosure and the appended claims are also intended to include multiple, unless the context clearly indicates otherwise. It is also to be understood that the term "and/or" as used herein refers to any or all possible combinations that include one or more associated listed items.

Some embodiments of the present disclosure will be described below in detail in combination with the accompanying drawings. The following example embodiments and features in the example embodiments are combinable with each other in the case of no conflict.

Figure 1:
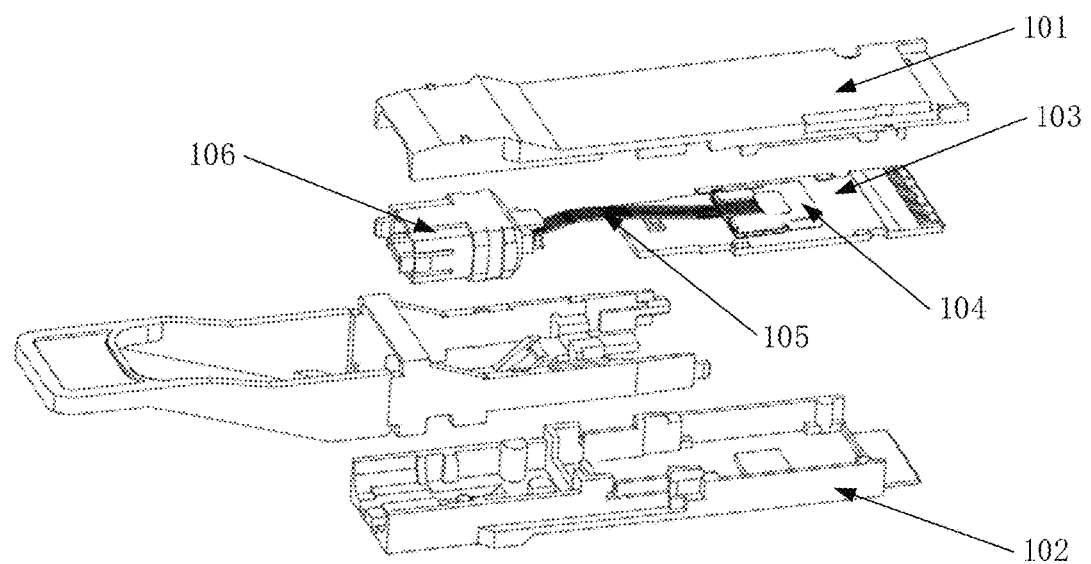
FIG. 1 is a schematic diagram illustrating a structure of an optical module according to some embodiments of the present disclosure.

FIG. 1 is a schematic diagram illustrating a structure of an optical module according to some embodiments of the present disclosure. As shown in FIG. 1, the optical module includes an upper housing 101, a lower housing 102, a circuit board 103, a lens assembly 104, an optical fiber 105 and an optical fiber connector 106.

A first cavity for wrapping devices such as the circuit board 103, the lens assembly 104 and the optical fiber 105 is formed by the upper housing 101 and the lower housing 102. The lens assembly 104 is on a surface of the circuit board 103. A laser chip, an optical monitoring chip and a laser driving chip are packaged between the lens assembly 104 and the circuit board 103. Specifically, a second cavity is enclosed by a lower surface of the lens assembly 104 and the circuit board 103, and the laser chip, the optical monitoring chip and the laser driving chip are in the second cavity. A groove is formed on an upper surface of the lens assembly 104, and a bottom of the groove protrudes to form a structure for changing an optical propagation direction.

An optical module according to some embodiments of the present disclosure includes a circuit board, a laser chip, an optical monitoring chip, a laser driving chip and a lens assembly. The laser chip, the laser driving chip and the optical monitoring chip are attached onto the surface of the circuit board. The laser driving chip is between the optical monitoring chip and the laser chip. A bottom surface of the lens assembly is covered above the laser chip and the optical monitoring chip. A groove is on a top surface of the lens assembly, and a bottom of the groove protrudes to form a first interface and a second interface. Light emitted by the laser chip is reflected to the second interface through the first interface. The light is reflected and refracted through the second interface. The light reflected through the second interface is transmitted to the optical monitoring chip, and the light refracted through the second interface is emitted from the lens assembly.

It can be seen from the above embodiments that the light beams are separated by the first interface and the second interface of the lens assembly. Two light beams in different directions are formed by reflection and refraction, and the light beam reflected to the optical monitoring chip monitors the optical power.

Figure 2:
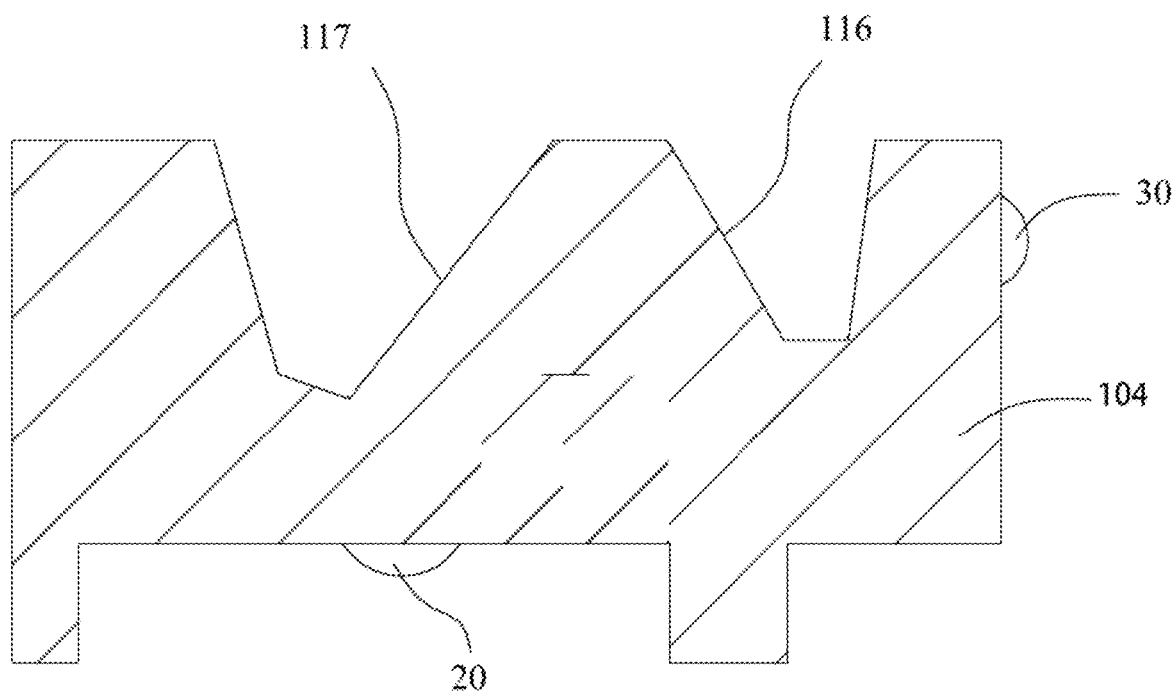
FIG. 2 is a schematic diagram illustrating a structure of a lens assembly according to some embodiments of the present disclosure.
Figure 3:
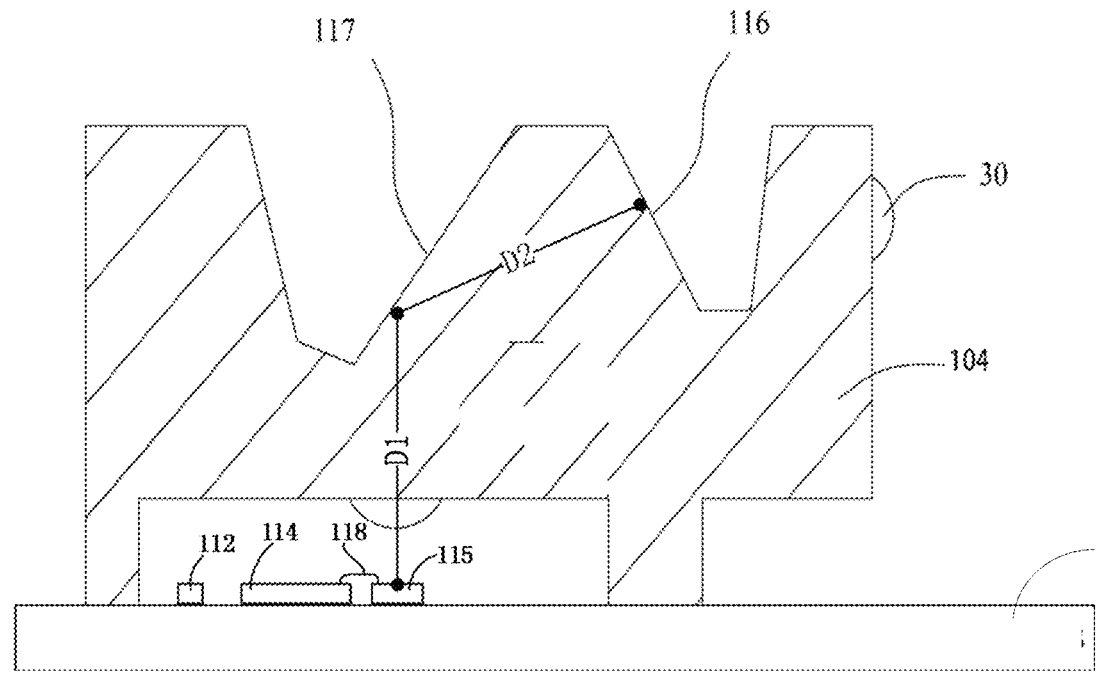
FIG. 3 is a schematic diagram illustrating a local structure of an optical module according to some embodiments of the present disclosure.

FIG. 2 is a schematic diagram illustrating a structure of a lens assembly 104 according to some embodiments of the present disclosure. As shown in FIG. 2, a lower surface of the lens assembly 104 is recessed to form a semi-open space, and a closed second cavity is formed by the lower surface of the lens assembly 104 and the circuit board 103 (as shown in FIG. 3). The second cavity is configured to receive the laser chip, the laser driving chip and the optical monitoring chip. The lower surface of the lens assembly 104 has a collimating lens 20 (i.e. a first lens) in the second cavity. The collimating lens 20 is configured to converge and collimate divergent light emitted by the laser chip into parallel light, and thus transmit the parallel light into the lens assembly 104. A groove is on an upper surface of the lens assembly 104, and a protrusion at a bottom of the groove forms a first interface 117 and a second interface 116. The light collimated by the collimating lens 20 is reflected at the first interface 117, and further propagated toward the second interface 116. Reflected light and refracted light are generated due to light reflection and refraction at the second interface 116. The refracted light is converged by a converging lens 30 (i.e., a second lens) and then enters the optical fiber 105, and the reflected light is emitted from the lens assembly 104 and finally transmitted to a surface of the optical monitoring chip.

A protrusion is formed in the groove on the upper surface of the lens assembly 104. An outer surface of the protrusion has two oblique surfaces, that is, a first interface 117 and a second interface 116. The light is reflected by the first interface 117 toward the second interface 116, and then reflected and refracted at the second interface 116. The effect of light beam separation and propagation direction change is achieved through such structural design of the lens assembly 104. Two light beams are emitted from the lens assembly 104. A beam is transmitted to the optical monitoring chip, and the other beam is transmitted into the optical fiber 105. The groove is mainly formed to produce interfaces satisfying reflection and refraction conditions. The first interface 117 and the second interface 116 both belong to an interface of an optically thinner medium and an optically denser medium, and therefore satisfy the basic requirements of reflection and refraction. In addition, a film is coated on the surface to satisfy the requirements of light reflection and refraction. In some embodiments, total reflection occurs at the first interface, and reflection and refraction occur at the second interface 116.

The lens assembly 104 of the present disclosure is formed integrally by using a polymer material through an injection molding process. Specifically, the material for manufacturing the lens assembly 104 includes light transmissive materials, such as polyetherimide (PEI) plastics (Ultem series). All light beam propagating elements in the lens assembly 104 are formed by a single sheet of the same polymer material, thereby greatly reducing forming molds and lowering manufacturing costs and complexity. Meanwhile, only the positions of an incident light beam and the optical fiber 105 are adjusted based on the above structure of the lens assembly 104 in the embodiments of the present disclosure, and thus installation and debugging are simplified.

In some embodiments of the present disclosure, the laser chip is a Vertical Cavity Surface Emitting Laser (VCSEL), and the light beam emitted by the laser chip is a laser beam.

In some embodiments, a distance between the collimating lens 20 and a light emitting point of the laser chip is set to a focal length of the collimating lens 20, so that divergent light beams emitted by the laser chip are collimated and changed into parallel/convergent light beams by the collimating lens 20 for propagation after reaching the collimating lens 20.

FIG. 3 is a schematic diagram illustrating a local structure of an optical module according to some embodiments of the present disclosure. In FIG. 3, a laser chip 115, a laser driving chip 114 and an optical monitoring chip 112 are attached onto a surface of a Printed Circuit Board (PCB) 103, and located in a cavity formed by the circuit board 103 and the lens assembly 104.

The laser driving chip 114 and the laser chip 115 are electrically connected by a wire 118. In some embodiments, a size of the laser driving chip 114 is far greater than a size of the laser chip 115, and is also far greater than a size of the optical monitoring chip 112.

The light emitted by the laser chip 115 is transmitted into the lens assembly 104, and then reflected at the first interface 117. A distance between the laser chip 115 and the first interface 117, that is, a distance D1 as shown in FIG. 3, is measured according to a travelling path of an optical path. A distance between the first interface 117 and the second interface 116, that is, a distance D2 as shown in FIG. 3, is measured according to a travelling path of light between the first interface 117 and the second interface 116. The distance D1 between the laser chip 115 and the first interface 117 is greater than the distance D2 between the first interface 117 and the second interface 116.

In some embodiments, the above arrangement allows the light reflected from the second interface 116 to be transmitted to an optical monitoring chip 112 at a side of the laser chip 115. Specifically, the optical fiber 105 and the optical monitoring chip 112 are at two opposite sides of the laser chip 115. The first interface 117 enables the light to be transmitted to the optical fiber 105, and the second interface 116 enables partial light to be reflected to the optical monitoring chip 112. The partial light is emitted from the lower surface of the lens assembly 104, and a light emitting position on the lower surface of the lens assembly 104 is between the laser chip 115 and the optical monitoring chip 112.

In some embodiments, to achieve the above optical path, to reflect the light into the optical monitoring chip 112 through the second interface 116, a relationship of the distance between the laser chip 115 and the first interface 117 and the distance between the first interface 117 and the second interface 116 is controlled in the design of the lens assembly 104.

When the distance between the first interface 117 and the second interface 116 is too large, the light emitted from the lower surface of the lens assembly 104 is transmitted to a surface of the circuit board 103. That is, the light emitting position on the lower surface of the lens assembly 104 is not between the laser chip 115 and the optical monitoring chip 112, and thus it is difficult for the light to transmit onto the optical monitoring chip 112 at the other side of the laser chip 115. The distance relationship is related to a reflection angle of the second interface 116 as well.

Specifically, to achieve the above optical path, an angle between the second interface 116 and the surface of the circuit board 103 is between 45° and 90°.

Figure 4A:
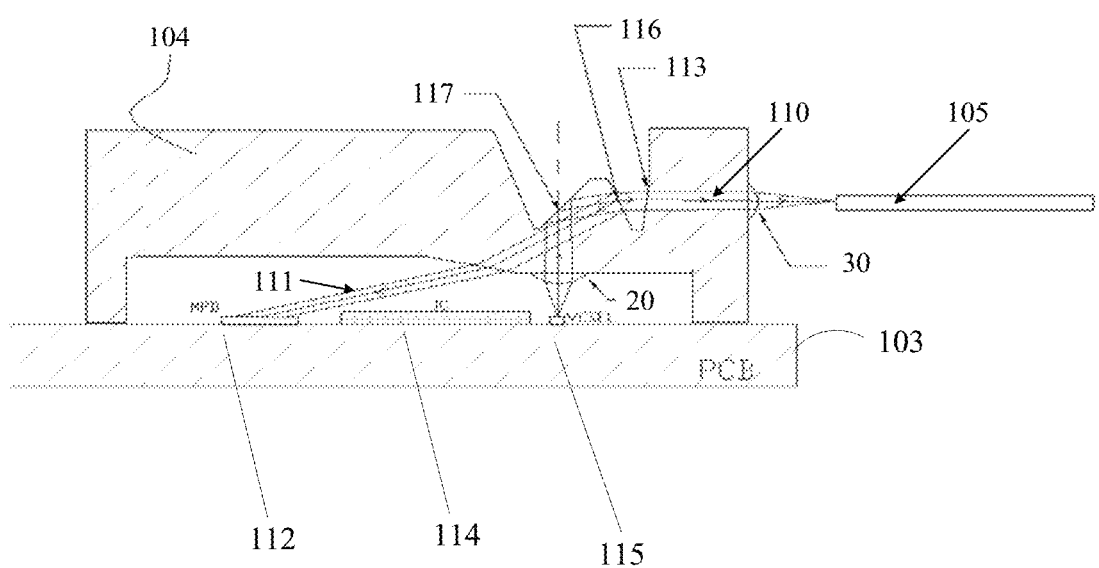
FIG. 4A is a schematic diagram illustrating an optical path of an optical module according to some embodiments of the present disclosure.

FIG. 4A is a schematic diagram illustrating an optical path of an optical module according to some embodiments of the present disclosure. In FIG. 4A, an optical monitoring chip 112 such as a Monitor Photo-Diode (MPD), a laser driving chip 114 such as an Integrated Circuit (IC) chip, and a laser chip 115 such as VCSEL are on the circuit board of the optical module. The VCSEL 115 has a feature of emitting light perpendicular to the surface of the circuit board 103.

The laser chip 115 emits divergent light. In some embodiments, the divergent light emitted by the laser chip 115 is formed into a collimated optical path after being converged by the collimating lens 20. The collimating lens 20 is a part of the lens assembly 104 which is manufactured through an integral molding process.

After being emitted from the laser chip 115, the light enters the collimating lens 20 through air propagation. Then, the light enters the lens assembly 104 after being converged and collimated by the collimating lens 20. The light is reflected at the first interface 117 to form a reflected light, and a propagation direction of the reflected light is toward the second interface 116. The propagation direction of the reflected light is not parallel to the surface of the circuit board. In some embodiments, total reflection occurs at the first interface 117 to reduce a loss of optical power.

The light is reflected and refracted at the second interface 116. The reflected light is transmitted to the optical monitoring chip 112, and the optical monitoring chip 112 and the laser chip 115 are at two opposite sides of the laser driving chip 114 respectively. In some embodiments, a distance between the optical monitoring chip 112 and the laser chip 115 is adjusted according to the size of the laser driving chip 114. The distance between the optical monitoring chip 112 and the laser chip 115 is increased along with the increase of the size of the laser driving chip 114. In addition, the optical monitoring chip 112 is at a side that is on the circuit board 103 and close to a golden finger on the circuit board 103. The laser chip 115 is at a side that is on the circuit board 103 and close to the optical fiber 105. This disposal helps to realize a shorter electrical connection between the optical monitoring chip 112 and an electrical interface of the circuit board 103, and realize a shorter optical connection between the laser chip 115 and an optical interface of the lens assembly 104.

In some embodiments, both reflection and refraction occur at the second interface 116. The optical monitoring chip 112 detects an intensity of transmitted light output through the optical fiber 105 based on an allocation proportion of the reflected light beam and a refracted light beam by analyzing an intensity of a received reflected light beam. It is understood that a proportion between an intensity of back light (i.e., the reflected light beam) of the second interface 116 and an intensity of front light (i.e., an unreflected and unrefracted light beam before being transmitted into the second interface 116) is known. In other words, the proportion of the intensity of the reflected light beam of the second interface 116 and the intensity of the refracted light beam of the second interface 116 is also determined. Therefore, the intensity of the refracted light beam is determined based on the intensity of the reflected light beam.

When the light is refracted at the second interface 116, the refracted light 110 is emitted from the lens assembly 104. Specifically, the refracted light is transmitted into a recessed part 113 on a side wall of the lens assembly 104, transmitted from the recessed part 113 of the lens assembly 104 toward a focusing lens 30 on the lens assembly 104, and then enters the optical fiber 105.

When passing through the recessed part 113, the light is refracted to enable the propagation direction of the light to be parallel to the surface of the circuit board 103 so that the propagation direction is same as the direction of the optical fiber 105, thereby facilitating effective coupling into the optical fiber 105.

Figure 4B:
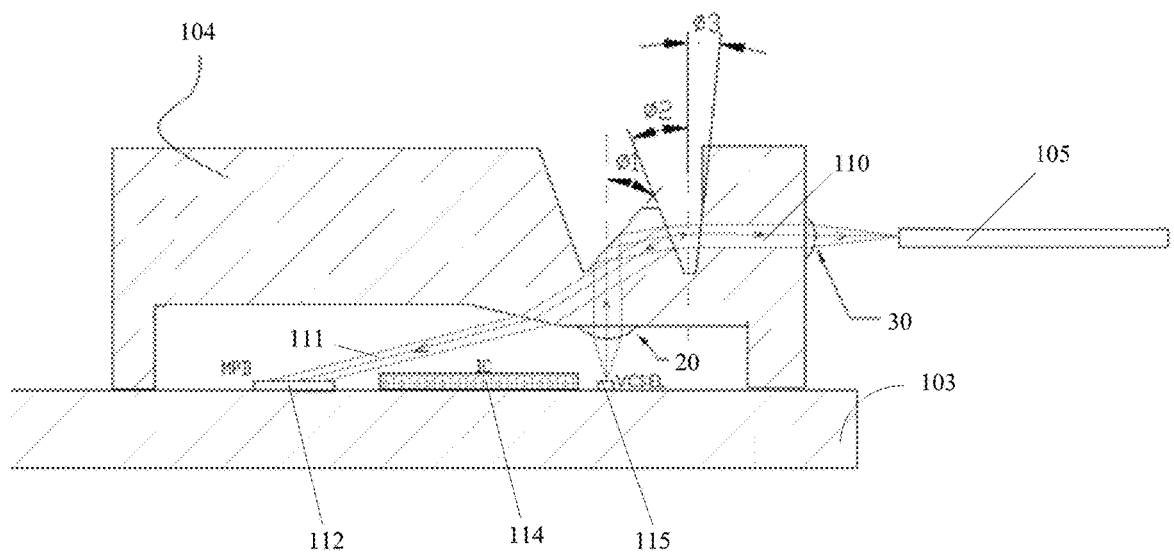
FIG. 4B is a schematic diagram illustrating an optical path of an optical module according to some embodiments of the present disclosure.

In FIG. 4B, an angle $\phi_3$ of the recessed part 113, an angle $\phi_1$ of the first interface 117 and an angle $\phi_2$ of the second interface 116 cooperate with one another. The propagation directions of the light are changed sequentially at the first interface 117, the second interface 116 and the recessed part 113, so that the light initially propagated perpendicular to the surface of the circuit board 103 is changed to be parallel to the surface of the circuit board 103. The above angles are set within a corresponding range according to an actual situation.

In some embodiments, total reflection occurs at the first interface. The angle of the first interface 117 is determined according to an optically denser medium, an optically thinner medium and a light wavelength. In some embodiments, the angles of the second interface 116 and the recessed part are determined sequentially. The second interface 116 is able to reflect the light to the light monitoring chip and refract the light to the optical fiber 105.

In some embodiments of the present disclosure, when the light beam is propagated from the laser chip 115 into the lens assembly 104, the light beam is propagated from the optically thinner medium to the optically denser medium. After the light beam is propagated from the first interface 117 to the second interface 116, when the reflected light transmitted to the optical monitoring chip 112 through the second interface 116 is not yet emitted from the lens assembly 104, the reflected light is propagated within the optically denser medium. When the reflected light is emitted from the lens assembly 104 and refracted to the optical monitoring chip 112, the reflected light is propagated within the optically thinner medium, the refracted light transmitted from the second interface 116 to the recessed part 113 is propagated within the optically thinner medium, and the light 110 transmitted to the focusing lens 30 through the recessed part 113 is propagated within the optically denser medium.

In the optical module according to some embodiments of the present disclosure, since the lens assembly 104 is formed integrally by using the same polymer material, forming molds are reduced greatly and manufacturing costs and complexity are lowered effectively. In some embodiments, a light spot diameter of the light beam propagated to the optical fiber 105 is effectively decreased by adjusting the angles of the first interface 117 and the second interface 116, which improves a focusing efficiency of the optical module. Therefore, an optical alignment precision is improved, and a propagation efficiency of the optical fiber 105 is improved.

Figure 5:
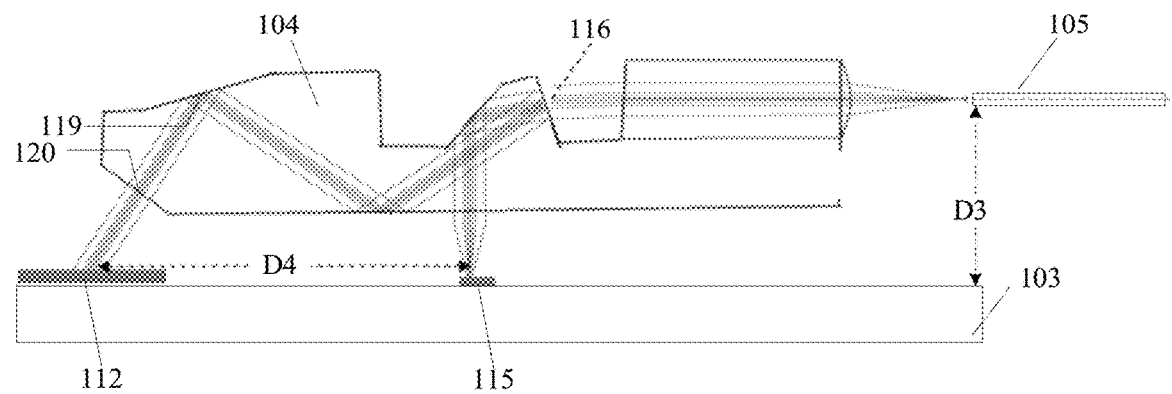
FIG. 5 is a schematic diagram illustrating an optical path of another optical module according to some embodiments of the present disclosure.

In some circumstances, the distance from the optical fiber 105 to the circuit board 103 is shorter, so that the reflected light generated from the second interface 116 has a shorter optical path between the second interface 116 and the lower surface of the lens assembly 104. Therefore, the refracted light generated on the lower surface of the lens assembly 104 is possibly not transmitted to the optical monitoring chip 112. In some embodiments of the present disclosure, as shown in FIG. 5, the lens assembly 104 further includes a third interface 119 and a fourth interface 120. The third interface 119 and the fourth interface 120 are disposed based on the distance D3 from the optical fiber 105 to the circuit board 103, so that the refracted light emitted from the lower surface of the lens assembly 104 is transmitted to the optical monitoring chip 112. Specifically, the reflected light beam obtained through the second interface 116 is transmitted to the lower surface of the lens assembly 104, re-reflected on the lower surface of the lens assembly 104, and transmitted to the third interface 119 of the lens assembly 104. Then, the reflected light beam is reflected at the third interface 119 and transmitted to the fourth interface 120, and then refracted at the fourth interface 120 and transmitted to the optical monitoring chip 112. In some embodiments, total reflections occur at the lower surface of the lens assembly 104 and the third interface 119. Even if the distance from the optical fiber to the circuit board 103 is short, the optical path in the lens assembly 104 is extended by disposing the third interface 119 and the fourth interface 120 in the lens assembly 104. In this way, the refracted light emitted from the lens assembly 104 is transmitted to the optical monitoring chip 112.

In some embodiments, the third interface 119 and the fourth interface 120 are disposed or adjusted based on a distance D4 between the optical monitoring chip 112 and the laser chip 115 as well as based on the distance from the optical fiber to the circuit board 103.

After considering the specification and practicing the present disclosure, the persons of skill in the art may easily conceive of other embodiments of the present disclosure. The present disclosure is intended to include any variations, uses and adaptive changes of the present disclosure. These variations, uses and adaptive changes follow the general principle of the present disclosure and include common knowledge or conventional technical means in the art not disclosed in the present disclosure. The specification and example embodiments herein are intended to be illustrative only and the real scope and spirit of the present disclosure are indicated by the claims of the present disclosure.

It is to be understood that the present disclosure is not limited to the precise structures described above and shown in the accompanying drawings and may be modified or changed without departing from the scope of the present disclosure. The scope of protection of the present disclosure is limited only by the appended claims.

The invention claimed is:

1. An optical module, comprising:
a circuit board;
an optical fiber;
an optical monitoring chip on a surface of the circuit board;
a laser chip on the surface of the circuit board and between the optical fiber and the optical monitoring chip;
a laser driving chip on the surface of the circuit board and between the optical monitoring chip and the laser chip;
a lens assembly whose bottom surface is covered above the laser chip and the optical monitoring chip; and
a groove on a top surface of the lens assembly and whose bottom protrudes to form a first interface and a second interface;
wherein
the first interface is configured to reflect light emitted by the laser chip,
the second interface is configured to reflect a first portion of the reflected light and refract a second portion of the reflected light,
the lens assembly comprises a third interface and a fourth interface,
the third interface is configured to receive and reflect the first portion of the reflected light,
the optical monitoring chip is configured to, via the fourth interface, receive the first portion of the reflected light from the third interface, and
the optical fiber is configured to receive the second portion of the reflected light.

2. The optical module according to claim 1, wherein a distance between the first interface and the second interface is less than a distance between the laser chip and the first interface.

3. The optical module according to claim 1, wherein a bottom surface of the lens assembly comprises a light emitting position for the second reflected light, and the light emitting position on a lower surface of the lens assembly is between the laser chip and the optical monitoring chip.

4. The optical module according to claim 1, wherein an angle between the second interface and the surface of the circuit board is in a range of 45° to 90°.

5. The optical module according to claim 1, wherein
a side wall of the lens assembly further comprises a recessed part which is configured to receive the first refracted light and refract the first refracted light to obtain a second refracted light, and
a propagation direction of the second refracted light is parallel to the surface of the circuit board.

6. The optical module according to claim 1, wherein the light emitted by the laser chip is configured for total reflection at the first interface.

7. The optical module according to claim 1, wherein the lens assembly comprising the groove, the first interface and the second interface is integrally formed.

8. The optical module according to claim 1, wherein the lens assembly comprises:
a first lens on the bottom surface of the lens assembly and configured to collimate the light emitted by the laser chip; and
a second lens on a side surface of the lens assembly closest to the optical fiber, the second lens being configured to converge the refracted light generated at the second interface.

9. The optical module according to claim 8, wherein the lens assembly comprising the groove, the first interface, the second interface, the first lens and the second lens is integrally formed.

10. The optical module according to claim 1, wherein the third interface and the fourth interface are disposed based on a distance from the optical fiber to the circuit board to enable the refracted light emitted from the bottom surface of the lens assembly to be transmitted to the optical monitoring chip.

* * * * *